(12) United States Patent
Yasutomi et al.

(10) Patent No.: US 10,837,767 B2
(45) Date of Patent: Nov. 17, 2020

(54) ANGLE DETECTION SYSTEM

(71) Applicant: TOPCON CORPORATION, Tokyo (JP)

(72) Inventors: Satoshi Yasutomi, Tokyo (JP); Yuji Takano, Tokyo (JP)

(73) Assignee: TOPCON CORPORATION, Tokyo (JP)

( * ) Notice: Subject to any disclaimer, the term of this patent is extended or adjusted under 35 U.S.C. 154(b) by 0 days.

(21) Appl. No.: 16/573,314

(22) Filed: Sep. 17, 2019

(65) Prior Publication Data
US 2020/0109941 A1    Apr. 9, 2020

(30) Foreign Application Priority Data
Oct. 4, 2018 (JP) .................................. 2018-189042

(51) Int. Cl.
*G01B 11/27* (2006.01)
*G01B 11/02* (2006.01)
(Continued)

(52) U.S. Cl.
CPC .......... *G01B 11/272* (2013.01); *G01B 11/026* (2013.01); *H03M 7/6011* (2013.01); *H01L 31/107* (2013.01)

(58) Field of Classification Search
CPC .. G01N 2800/30; G01N 33/569; G01N 23/04; G01N 21/8901; G01N 2291/106; G01N 2291/2693; G01N 29/043; G01N 29/225; G01N 29/265; G02B 26/108; G02B 23/16; G02B 23/14; G01C 15/002; G01C 15/00; G01C 1/04; G01C 15/06; G01C 15/004; G01C 21/165; G01C 15/008; G01C 15/02; G01C 1/02; G01C 11/02;
(Continued)

(56) References Cited

U.S. PATENT DOCUMENTS 6,427,780 B1 * 8/2002 Kimura .................... E02F 3/847
                                                                172/2
6,433,866 B1 * 8/2002 Nichols .................... G01S 19/07
                                                                356/141.1
(Continued)

FOREIGN PATENT DOCUMENTS

JP         H05172588 A    7/1993

*Primary Examiner* — Michael P Stafira
(74) *Attorney, Agent, or Firm* — Roberts Calderon Safran & Cole P.C.

(57) ABSTRACT

Provided is an angle detection system including: a target unit including a reflection target and an encoder pattern showing an angle of the target unit; and a surveying instrument including a survey unit configured to measure a distance and angle to the reflection target, an encoder pattern reading unit configured to read a bit pattern of the encoder pattern from an image of the encoder pattern, a display unit, and an arithmetic control unit. The surveying instrument includes at least one imaging unit changeable in focal length, and is configured to calculate a distance and angle to the reflection target, to set an imaging magnification of the imaging unit, to set a cutout region of the encoder pattern by using the image displayed on the display unit, to determine success of identification of the encoder pattern and, in the case of success, to calculate an encoder pattern read angle.

9 Claims, 9 Drawing Sheets

(51) Int. Cl.
*H03M 7/30* (2006.01)
*H01L 31/107* (2006.01)

(58) Field of Classification Search
CPC ........ G01C 11/025; G01C 1/00; G01C 21/16; G01C 11/18; G01C 15/006; G01C 15/08; G01C 25/00; G01C 3/02; G01C 3/04; G01C 3/08; G01C 5/00; G01B 11/026; G01B 11/272; G01B 7/26; G01B 11/245; G01B 11/25; G01B 21/04; G01B 11/002; G01B 11/005; G01B 11/26; G01B 9/02027; G01B 9/021
See application file for complete search history.

(56) References Cited

U.S. PATENT DOCUMENTS

| | | | | |
|---|---|---|---|---|
| 2001/0045534 | A1* | 11/2001 | Kimura | G01C 15/002 250/559.38 |
| 2016/0033307 | A1* | 2/2016 | Yanobe | G01C 3/02 356/6 |
| 2016/0274224 | A1* | 9/2016 | Nordenfelt | G01S 7/4817 |
| 2017/0307370 | A1* | 10/2017 | Tanaka | G01C 1/04 |
| 2018/0202805 | A1* | 7/2018 | Unger | G01C 3/08 |

* cited by examiner

ANGLE DETECTION SYSTEM

CROSS-REFERENCE TO RELATED APPLICATION

The present application claims priority under 35 U.S.C. § 119 to Japanese Patent Application No. 2018-189042 filed Oct. 4, 2018. The contents of this application are incorporated herein by reference in their entirely.

TECHNICAL FIELD

The present invention relates to an angle detection system, more specifically, to an angle detection system using a surveying instrument as a detector.

BACKGROUND ART

Conventionally, a rotary encoder has been known as an angle detection device to measure an angle (refer to, for example, Patent Literature 1). Conventionally, in a rotary encoder, on a built-in rotary disc, graduations such as slits according to the rule of a gray code or an M-sequence code, that is, a so-called encoder pattern is provided, and an image of light irradiated on the slits from a light emitting unit is received by an image sensor or the like, and from the image obtained by an image pickup device, an angular position in the rotary disc is operated.

Such an angle detection device as above measures an angular position corresponding to a rotational displacement of an input shaft connected coaxially to the disc. Therefore, a detector including a light emitting unit, an image pickup device, and a control unit controlling these members must be attached to the body of a measuring object.

CITATION LIST

Patent Literature

Patent Literature 1 Japanese Published Unexamined Patent Application No. H05-172588

SUMMARY OF INVENTION

Technical Problem

However, at a survey site, there is a case in which measurement of an angle of a remote measuring object is desired. Therefore, the applicant for the present invention proposed an angle detection system in which an encoder pattern portion similar to one illustrated in FIG. 3 and having an encoder pattern showing an angle in a circumferential direction around a central axis of a measuring object and being a barcode pattern of black and white or formed of a polarizing filter to shield polarization components was attached to an angle measuring object, and an angle code shown by the encoder pattern was read by an encoder pattern reading unit such as a camera or a scanner, and based on a pattern obtained from a result of the reading, a read angle was operated, and applied for a patent (Japanese Patent Application No. 2018-144784).

In a conventional rotary encoder, a disc disposed inside the device is irradiated by a light source disposed inside the device, and the light is received by an image pickup device disposed inside the device, so that accurate slit pattern reading is easily performed.

On the other hand, in the angle detection system proposed as above, first, a landscape image of a periphery of the encoder pattern is acquired, and the region of a recognized encoder pattern 13B is cut out into a rectangular shape from the landscape image, and cutout image or received light amount distribution data is converted into a bit pattern, and by comparing this with correlations between bit patterns and angles stored in advance in a storage unit, an angle in the circumferential direction with respect to a reference direction RD of the encoder pattern is operated.

Therefore, there was a problem that in a case where the distance from the surveying instrument to the encoder pattern is long, or the outdoor environment is not good (for example, it is dark or there is some object that obstructs accurate reading, such as dirt or dust), or the like, the encoder pattern could not always be accurately read.

The present invention was made in view of these circumstances, and an object thereof is to provide an angle detection system capable of accurately measuring an angle of a measuring object even when the measuring object is remote.

Solution to Problem

In order to achieve the above-described object, an angle detection system according to an aspect of the present invention is an angle detection system including: a target unit including a reflection target and an encoder pattern showing an angle in a circumferential direction around a central axis of the target unit; and a surveying instrument including a survey unit configured to perform a distance measurement and angle measurement to the reflection target, an encoder pattern reading unit configured to read a bit pattern by acquiring an image including the encoder pattern, cutting out a region of the encoder pattern from the image, and reading pixel rows, a display unit, and an arithmetic control unit, wherein the encoder pattern reading unit includes at least one imaging unit changeable in focal length, and the arithmetic control unit includes a distance and angle operation unit configured to calculate a distance and an angle to the reflection target based on the results of distance and angle measurement, an imaging magnification setting unit configured to set an imaging magnification of the imaging unit according to the distance, a cutout range adjusting unit enabling setting of a cutout region of the encoder pattern by using the image displayed on the display unit, an encoder pattern identification determination unit configured to determine whether or not encoder pattern identification is successful by collating the acquired image of the encoder pattern with a pattern template of an encoder pattern stored in advance in a storage unit, and perform reading again at an increased imaging magnification when the encoder pattern identification fails, and a read angle operation unit configured to calculate an encoder pattern read angle $\theta_E$ based on an image of an identified encoder pattern.

In the aspect described above, it is also preferable that the encoder pattern reading unit includes a first imaging unit changeable in focal length, and a second imaging unit having an angle of view narrower than that of the first imaging unit and being changeable in focal length, and the imaging magnification setting unit switches between the first imaging unit and the second imaging unit according to the distance.

In the aspect described above, it is also preferable that the cutout range adjusting unit is configured to display a center position of the reflection target on the display unit, and enable setting of a cutout region by matching one vertex and a center in a horizontal direction of a rectangular frame indicating the cutout region with one vertex of the encoder pattern in the acquired image and the center of the reflection target, respectively.

In the aspect described above, it is also preferable that the encoder pattern identification determination unit determines whether or not encoder pattern identification is successful by collating the encoder pattern in the acquired image with a pattern template of an encoder pattern stored in advance in the storage unit, and turns on an illumination light emitting unit and acquires an image again when the encoder pattern identification fails.

An angle detection system according to another aspect of the present invention includes a target unit including a reflection target and an encoder pattern showing an angle in a circumferential direction around a central axis of the target unit; and a scanner device including a survey unit configured to perform a distance measurement and angle measurement to the reflection target, an encoder pattern reading unit configured to read a bit pattern by emitting scanning light and receiving and acquiring reflected light from the encoder pattern as a received light amount distribution, a display unit, and an arithmetic control unit, wherein the arithmetic control unit includes a target scanning performing unit configured to calculate a distance and an angle to the reflection target based on the results of distance and angle measurement, a scanning speed setting unit configured to set a scanning speed of the scanner device according to the distance, an encoder pattern identification determination unit configured to determine whether or not encoder pattern identification is successful by collating the received light amount distribution of the encoder pattern with a pattern template of an encoder pattern stored in advance in a storage unit, and perform reading again at a decreased scanning speed when the encoder pattern identification fails, and a read angle operation unit configured to calculate an encoder pattern read angle $θ_E$ based on an received light amount distribution of an identified encoder pattern.

Benefit of Invention

With the angle detection system according to the aspect described above, the encoder pattern can be accurately read even when it is remote, so that an angle of a measuring object can be accurately measured even when the measuring object is remote.

DESCRIPTION OF EMBODIMENTS

Figure 1:
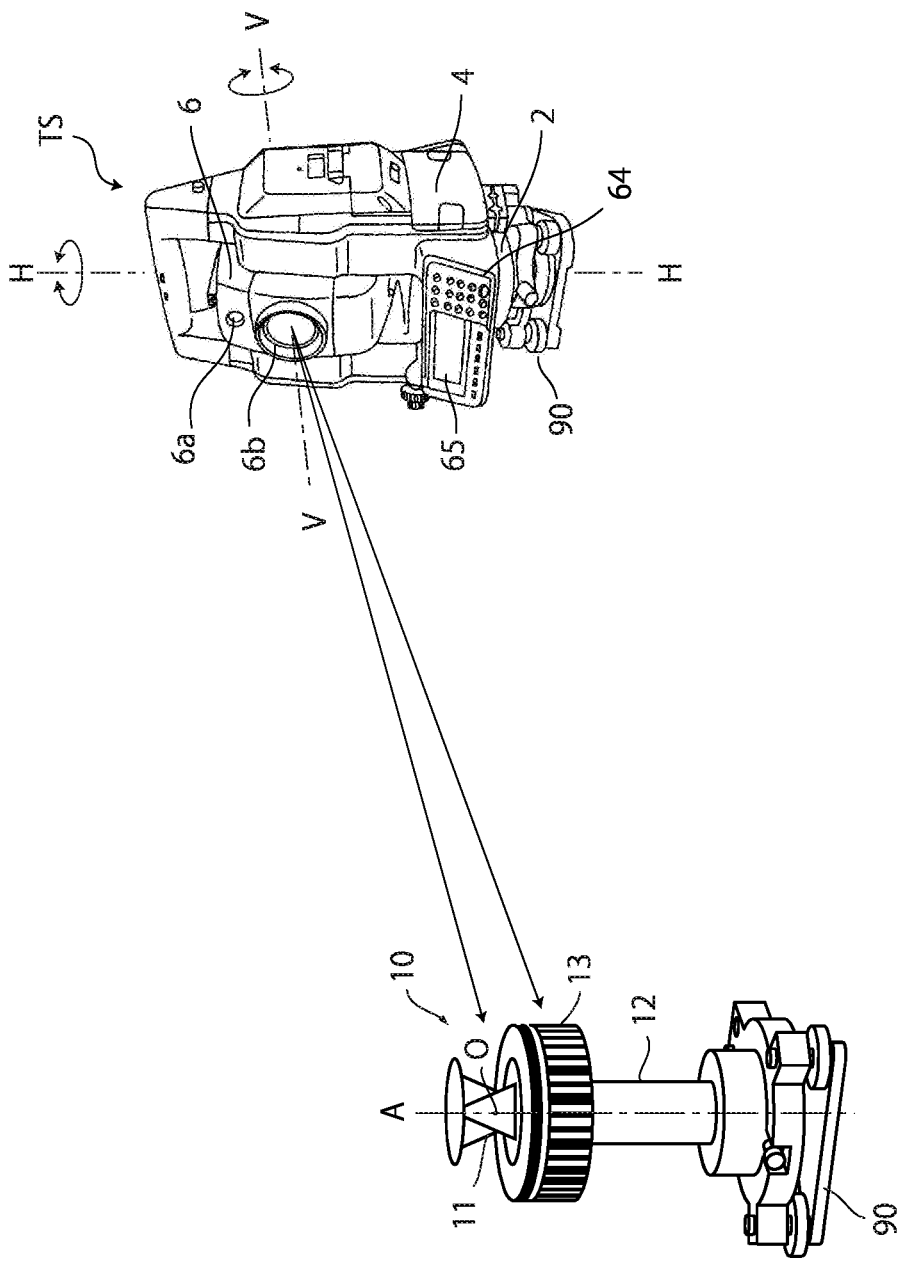
FIG. 1 is a schematic configuration diagram of an angle detection system according to a first embodiment of the present invention.

Preferred embodiments of the present invention are described with reference to the drawings. In the following description of the embodiments, the same components are provided with the same reference signs, and overlapping description is omitted. In each drawing, components are enlarged and schematically illustrated as appropriate for convenience of description, and which may not reflect actual ratios.

1. First Embodiment 1-1. Configuration of Angle Detection System

A configuration of an angle detection system 100 according to a first embodiment will be described with reference to FIG. 1 to FIG. 4. The angle detection system 100 includes a target unit 10 and a surveying instrument TS.

1-2. Configuration of Target Unit

The target unit 10 includes a support member 12 supporting a prism as a reflection target 11, and an encoder pattern portion 13 attached to the support member 12.

The reflection target 11 is, for example, a so-called omnidirectional prism configured by radially combining a plurality of triangular pyramid prisms, and reflects light that entered from its entire circumference (360°) toward directions opposite to the entering directions. That is, the reflection target 11 reflects distance measuring light from the surveying instrument TS toward the surveying instrument TS. However, the reflection target 11 is not limited to the omnidirectional prism, and may be a normal prism to be used for a survey.

The support member 12 extends over a certain length, and at its one end, fixes and supports the reflection target 11 so that a central axis A of the support member passes through a center O of the reflection target 11.

The other end of the support member 12 can be configured into various shapes according to its purpose. For example, the other end of the support member 12 may extend like a pole and be brought into contact as a ferrule with a working surface. As another example, as illustrated in FIG. 1, the other end of the support member 12 may be configured to be mountable on a leveling base 90.

The encoder pattern portion 13 is configured by being provided with an encoder pattern 13B on a side circumferential surface of a base 13A that has a short columnar shape. The base 13A is fixed between the support member 12 and the reflection target 11 so as to become coaxial with a central axis A of the support member 12 by a means such as screwing a threaded portion (not illustrated) formed on an outer circumference of the support member into a screw hole (not illustrated) formed at a center of the base 13A, etc.

Figure 3A:
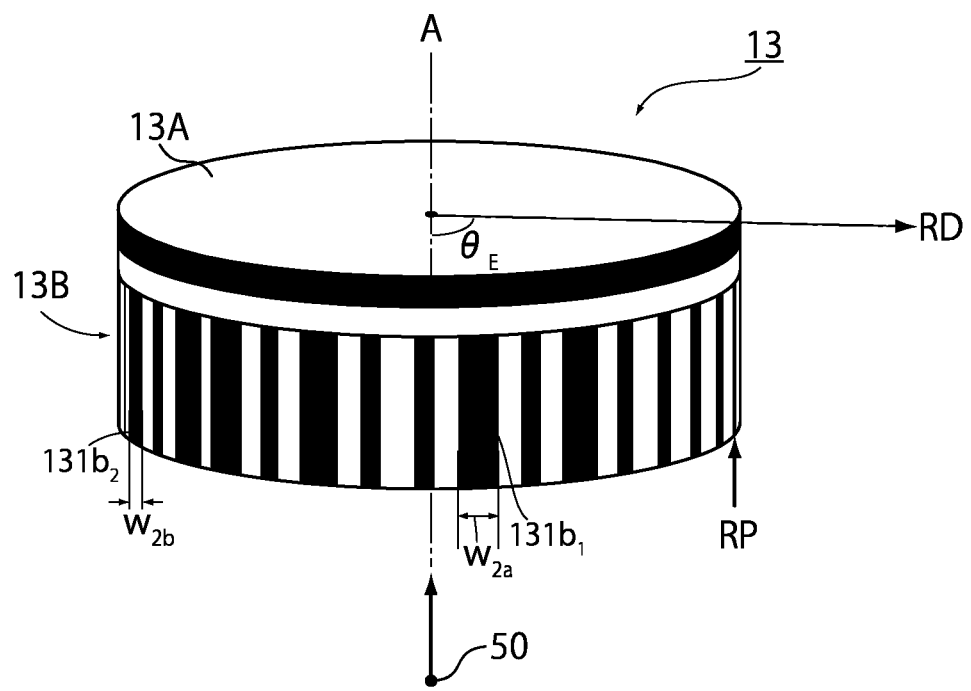
FIG. 3A and FIG. 3B are enlarged views of an encoder pattern portion relating to the angle detection system of the same embodiment.
Figure 3B:
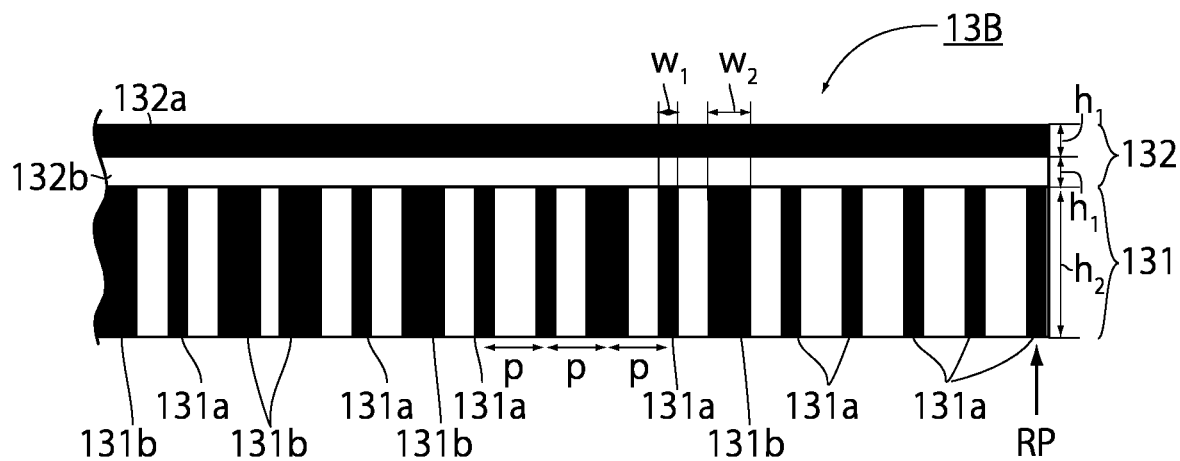

As illustrated in FIG. 3A and FIG. 3B, the angle information portion 131 is a barcode-like pattern formed by disposing, for example, narrow-width black vertical lines 131a with a width $w_1$ and wide-width black vertical lines 131b with a width $w_2$ at even pitches p on a white background by defining the vertical lines 131a as "0" and the vertical lines 131b as "1" so as to generate an M-sequence recurring random number code. The encoder pattern 13B is configured so that, by setting a direction RD from the center of the encoder pattern portion 13 to a reference point RP (hereinafter, referred to as a "reference direction of an encoder pattern") as 0°, an angle (hereinafter, referred to as an "encoder pattern read angle") $\theta_E$ calculated from the pattern read by the surveying instrument TS corresponds to an absolute angle in a clockwise circumferential direction around the central axis A of the support member 12, from the reference direction RD of the encoder pattern 13B.

The angle information portion 131 is configured so as to realize desired resolution by changing a bit number.

The bit pattern is not limited to an M-sequence code, and bit patterns such as a gray code and a pure binary code can be used, and these can be generated by a publicly known method. However, use of an M-sequence code is advantageous because it enables an increase in bit number without increasing tracks in number, and realizes high resolution with a simple configuration.

The width information portion 132 includes a black zone 132a with a predetermined height $h_1$ and a white zone 132b with the same height. The black zone 132a and the white zone 132b extend across the entire circumference of the encoder pattern portion 13 in the circumferential direction.

The encoder pattern 13B can be provided in the encoder pattern portion 13 by various publicly known methods that are used for forming patterns. The encoder pattern 13B may be provided by, for example, printing on a white sheet by a method of general printing, such as inkjet printing, and sticking onto the side circumferential surface of the base 13A. According to this method, the encoder pattern portion 13 can be formed by an extremely inexpensive and simple method. The encoder pattern 13B may be provided by being directly printed on a resin-made base 13A. Alternatively, the encoder pattern 13B may be provided on a metal-made base 13A by a method such as painting or vapor deposition, etc.

In the illustrated example, the width information portion 132 is disposed above and adjacent to the angle information portion 131. However, the positional relationship between the angle information portion 131 and the width information portion 132 is not limited to this.

The encoder pattern portion 13 is disposed below and adjacent to the reflection target 11. However, the positional relationship between the encoder pattern portion 13 and the reflection target 11 is not limited to this. Another disposition is possible as long as the encoder pattern portion 13 is disposed coaxially with the central axis A of the support member 12 passing through the center O of the reflection target 11. The positional relationship between the encoder pattern portion 13 and the reflection target 11 is made known, and stored in advance in a storage unit 63 of the surveying instrument TS.

1-3. Configuration of Surveying Instrument

Figure 2:
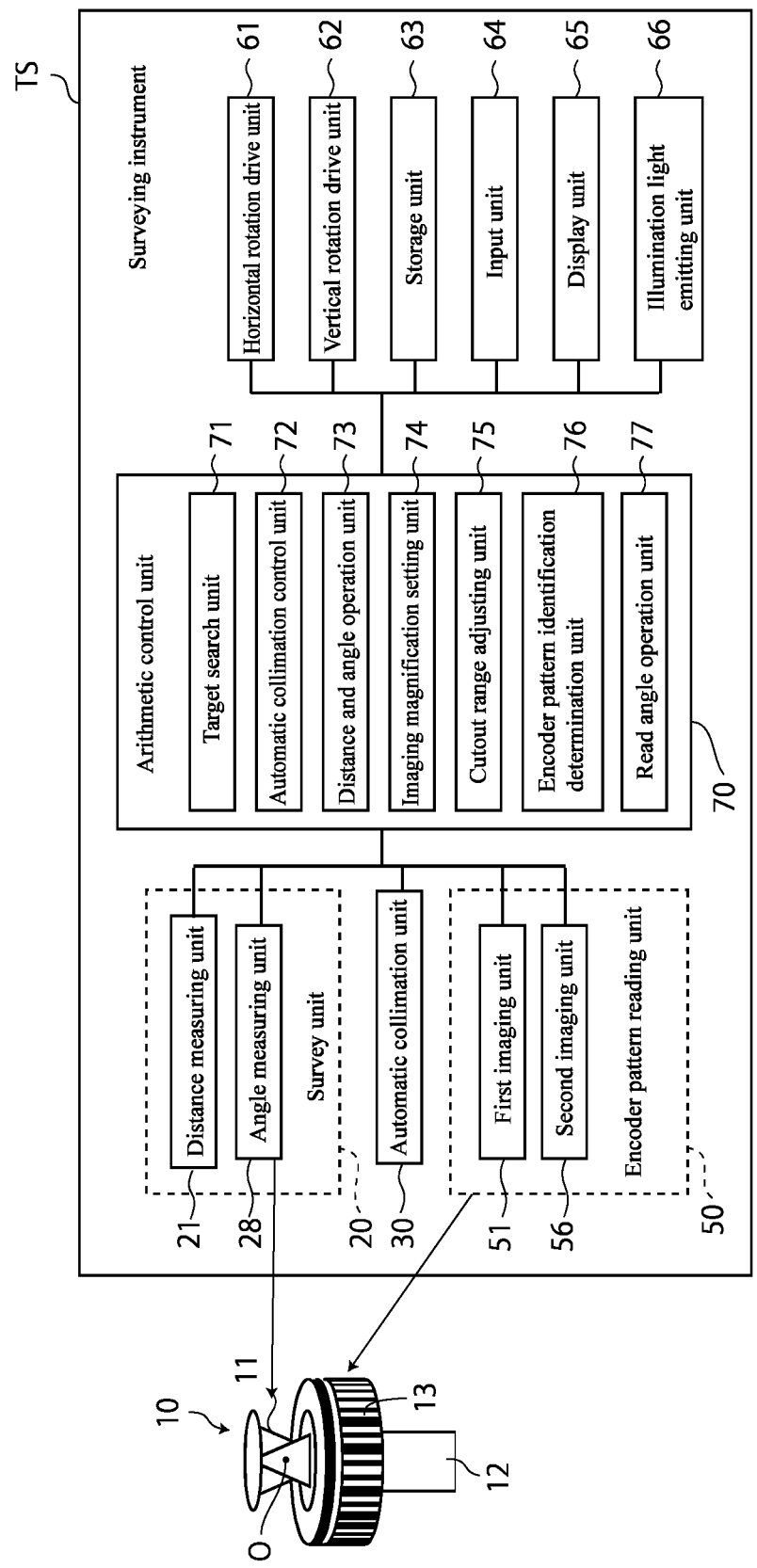
FIG. 2 is a configuration block diagram of the angle detection system of the same embodiment.

The surveying instrument TS in the present embodiment is a total station. As illustrated in FIG. 2, the surveying instrument TS includes a survey unit 20 including a distance measuring unit 21 and an angle measuring unit 28, an automatic collimation unit 30, an encoder pattern reading unit 50, a horizontal rotation drive unit 61, a vertical rotation drive unit 62, a storage unit 63, an input unit 64, a display unit 65, and an arithmetic control unit 70.

As illustrated in FIG. 1, the surveying instrument TS includes, in appearance, a base portion 2 to be removably mounted on the leveling base 90, a bracket portion 4 provided on the base portion 2 to be horizontally rotatable 360° around an axis H-H, and a telescope 6 provided to be vertically rotatable around an axis V-V in a concave portion of the bracket portion 4.

In the base portion 2, the horizontal rotation drive unit 61 and a horizontal angle detector that detects a rotation angle around the axis H-H of horizontal rotation are housed.

In the bracket portion 4, a vertical angle detector, the vertical rotation drive unit 62, the storage unit 63, and the arithmetic control unit 70 are housed. The input unit 64 and the display unit 65 are provided outside the bracket portion 4.

The telescope 6 includes a first telescope portion 6a and a second telescope portion 6b. In the first telescope portion 6a, a first imaging unit 51 is disposed, and in the second telescope portion 6b, the distance measuring unit 21, the automatic collimation unit 30, and a second imaging unit 56 are disposed.

Figure 4:
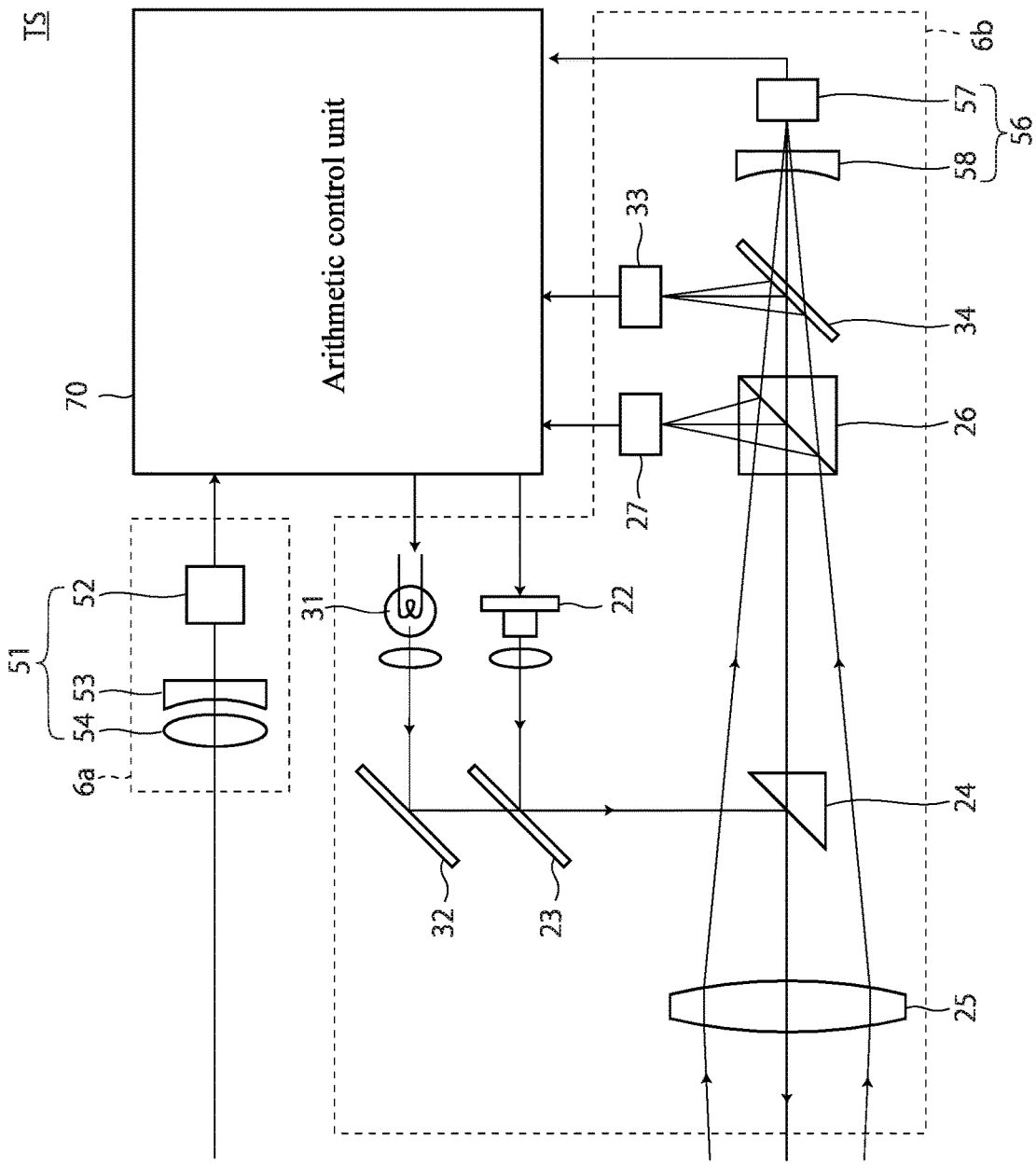
FIG. 4 is a diagram describing a configuration of an optical system of the angle detection system of the same embodiment.

In the distance measuring unit 21, as illustrated in FIG. 4, a distance to the reflection target 11 is measured by distance measuring light emitted from the distance measuring light emitting unit 22 including a light emitting element such as an LED being emitted toward the reflection target 11 through a deflecting mirror 23, a reflection prism 24, and an objective lens 25, and receiving reflected light from the reflection target 11 by a distance measuring light receiving unit 27 including a light receiving element such as an avalanche photodiode through the objective lens 25 and a dichroic mirror 26.

The angle measuring unit 28 includes a horizontal angle detector and a vertical angle detector. The horizontal angle detector and the vertical angle detector are for example, rotary encoders, and respectively detect rotation angles around rotation axes of the bracket portion 4 and the telescope 6 respectively driven by the horizontal rotation drive unit 61 and the vertical rotation drive unit 62, and obtain a horizontal angle and a vertical angle of a distance measuring optical axis.

The distance measuring unit 21 and the angle measuring unit 28 constitute the survey unit 20 as an essential portion of the surveying instrument TS.

The automatic collimation unit 30 includes a collimation light emitting unit 31, a deflecting mirror 32, a light receiving element 33, and a beam splitter 34, etc. Collimation light emitted by the collimation light emitting unit 31 is transmitted to the reflection target 11 through the deflecting mirror 32, and the reflection prism 24 and the objective lens 25 shared with the distance measuring unit 21, and reflected light is received by the light receiving element 33. The light receiving element 33 continues alternately imaging an image when the collimation light emitting unit 31 is made to emit light and an image when the collimation light emitting unit 31 is turned off.

The encoder pattern reading unit 50 includes a first imaging unit 51 functioning as a wide angle camera having a zooming function, and a second imaging unit 56 functioning as a narrow angle camera having a zooming function. The encoder pattern reading unit 50 acquires a landscape image of a periphery of the encoder pattern portion 13 including the reflection target 11 based on a positional relationship between the center O of the target unit 11 and the encoder pattern portion 13 and dimensions of the encoder pattern portion 13 stored in advance.

The first imaging unit 51 includes a first image pickup device 52, a focusing lens 53, and an objective lens 54, and forms an image of light that entered from the objective lens 54, on the first image pickup device 52, and acquires a photographic image with a wider angle of view than in the case using a normal lens. The first imaging unit 51 can change its focal length by moving the focusing lens 53 forward or backward in an optical axis direction.

The second imaging unit 56 includes a second image pickup device 57 and a focusing lens 58, etc., and forms an image of a portion of light that entered from the objective lens 25 shared with the distance measuring unit 21, on the second image pickup device 57 through a beam splitter 34, and acquires a photographic image with a narrower angle of view than in the case of the first image pickup device 52. The second imaging unit 56 can change its focal length by moving the focusing lens 58 forward or backward in an optical axis direction.

The horizontal rotation drive unit 61 and the vertical rotation drive unit 62 are, for example, servo motors, and are respectively provided on the axis H-H of horizontal rotation and the axis V-V of vertical rotation. The horizontal rotation drive unit 61 and the vertical rotation drive unit 62 are controlled by the arithmetic control unit 70 to rotate the bracket 4 horizontally and rotate the telescope 6 vertically.

The storage unit 63 includes, for example, a ROM and a RAM. The storage unit 63 stores calculation programs and various control programs necessary for measurements. In addition, various information and settings, etc., necessary for reading of the encoder pattern, such as pattern templates of a search model for encoder pattern identification, the positional relationship between the reflection target 11 and the encoder pattern portion, and correlations between bit patterns of the encoder pattern and angles, are stored. The programs, etc., are read out as necessary by respective functional units, etc. In addition, necessary information is stored as appropriate, and input information input by the input unit 64 is also stored as appropriate.

The storage unit 63 includes, for example, a memory card, a USB memory, or the like, and stores distance and angle measurement data obtained through measurements, image data obtained by reading the encoder pattern, measurement point coordinates, read angle data, and direction angle data obtained through arithmetic operations. The storage unit 63 may be provided by being fixed, or may be provided removably.

The input unit 64 is, for example, operation buttons. An operator can input a command to be executed by the surveying instrument TS and select settings with the input unit 64.

The display unit 65 is, for example, a liquid crystal display, and displays various information such as measurement results and arithmetic operation results in response to a command of the arithmetic control unit 70. In addition, the display unit 65 displays setting information for inputting by an operator and commands input by an operator through the input unit 64.

The input unit 64 and the display unit 65 may be configured integrally as a touch panel display.

An illumination light emitting unit 66 emits light as illumination light when the first imaging unit 51 and the second imaging unit 56 acquires image information of a measuring object. As this illumination light emitting unit 66, a so-called guide light that is commonly used for a staking operation can be used.

The arithmetic control unit 70 is, for example, a CPU (Central Processing Unit). The arithmetic control unit 70 is electrically connected to the respective components of the surveying instrument described above. By controlling the respective components, each of the processing necessary for fulfillment of the functions of the surveying instrument TS such as measurements is performed, and data or signals from the survey unit 20, the automatic collimation unit 30, the encoder pattern reading unit 50, and the input unit 64 are input.

The arithmetic control unit 70 includes, as functional units, a target search unit 71, an automatic collimation control unit 72, a distance and angle operation unit 73, an imaging magnification setting unit 74, a cutout range adjusting unit 75, an encoder pattern identification determination unit 76, and a read angle operation unit 77.

The target search unit 71 performs a search action to search for the reflection target 11 of the target unit 10 by controlling the horizontal rotation drive unit 61 and the vertical rotation drive unit 62 while obtaining information from the angle measuring unit 28, along a predetermined search route within a predetermined search range as described in, for example, Japanese Published Unexamined Patent Application No. 2016-138802. As a pattern (search pattern) of the search route for the reflection target 11, various modes can be employed such as a pattern whorled outward from a position of the center (collimation axis) of a telescope's field of view, and a pattern of being gradually moved from one side to the other side in the up-down direction while being reciprocated in the left-right direction, or being gradually moved from one side to the other side in the left-right direction while being reciprocated in the up-down direction.

When at least a portion of the reflection target 11 enters the telescope's field of view (imaging range), based on information from the light receiving element 33 that continues alternately imaging an image when the collimation light emitting unit 31 is made to emit light and an image when the collimation light emitting unit is turned off, the target search unit 71 determines the presence of the reflection target 11 by extracting only the reflection target 11 from a contrast of the reflection target 11 through a differential image processing of the two images, and stops the search action based on the target search unit 71.

The automatic collimation control unit 72 controls the automatic collimation unit 30, and based on information from the light receiving element 33, calculates a horizontal deviation and a vertical deviation of the center of the reflection target from the collimation axis, and eliminates these deviations by driving of the horizontal rotation drive unit 61 and the vertical rotation drive unit 62, and accordingly, the collimation axis and the center O of the reflection target 11 are made to match each other.

Based on information from the distance measuring light receiving unit 27 (reference light made to enter the distance measuring light receiving unit 27 from the distance measuring light emitting unit 22 through a reference light optical system not illustrated, and reflected distance measuring light made to enter the distance measuring light receiving unit 27), the distance and angle operation unit 73 calculates a phase difference between the reflected distance measuring light and the reference light, and based on this phase difference, operates a distance to the reflection target 11, and based on angle measurement data obtained in the angle measuring unit, operates an angle to the reflection target, and stores the arithmetic operation results in the storage unit 63.

The imaging magnification setting unit 74 determines whether to use the first imaging unit 51 or the second imaging unit 56 based on a horizontal distance to the reflection target 11 calculated by the distance and angle operation unit 73, selects an optimum magnification in each imaging unit, and performs imaging at the selected magnification. Accordingly, the characteristics of the wide angle camera (first imaging unit 51) or the narrow angle camera (second imaging unit 56) can be effectively used to provide the encoder pattern 13B on the image with proper dimensions.

The cutout range adjusting unit 75 performs a display for switching to a camera image on a display unit to adjust an image cutout range, and when the switching is confirmed by an operator by, for example, depressing of an "Enter" key, an image on the display unit 65 is switched to an image of the encoder pattern 13B imaged by a camera.

The encoder pattern identification determination unit 76 acquires an image by the first imaging unit 51, and based on the image, detects the encoder pattern 13B near the reflection target 11. In detail, when relative positions of the reflection target 11 and the encoder pattern 13B are known, by using a distance value between the reflection target 11 and the encoder pattern 13B on the image operated from the relative positions, a position of the encoder pattern 13B is calculated, and from this position, by a method such as publicly known pattern search, information matching a pattern template of the encoder pattern 13B stored in advance is searched for and detected, and accordingly, whether or not identification is successful is determined.

Alternatively, when the support member 12 tilts, and relative positions of the reflection target 11 and the encoder pattern 13B are not known, radial searching from the center O of the reflection target 11 is performed, and information matching a pattern template of the search model of the encoder pattern 13B is searched for to perform recognition. This enables a proper identification of the encoder pattern from the image information.

From the reading result of the encoder pattern 13B, the read angle operation unit 77 operates a collimation optical axis (angle in the circumferential direction) of the surveying instrument with respect to a reference direction RD representing 0° of the encoder pattern 13B. Details will be described later.

1-4. Angle Detection Method

Figure 5:
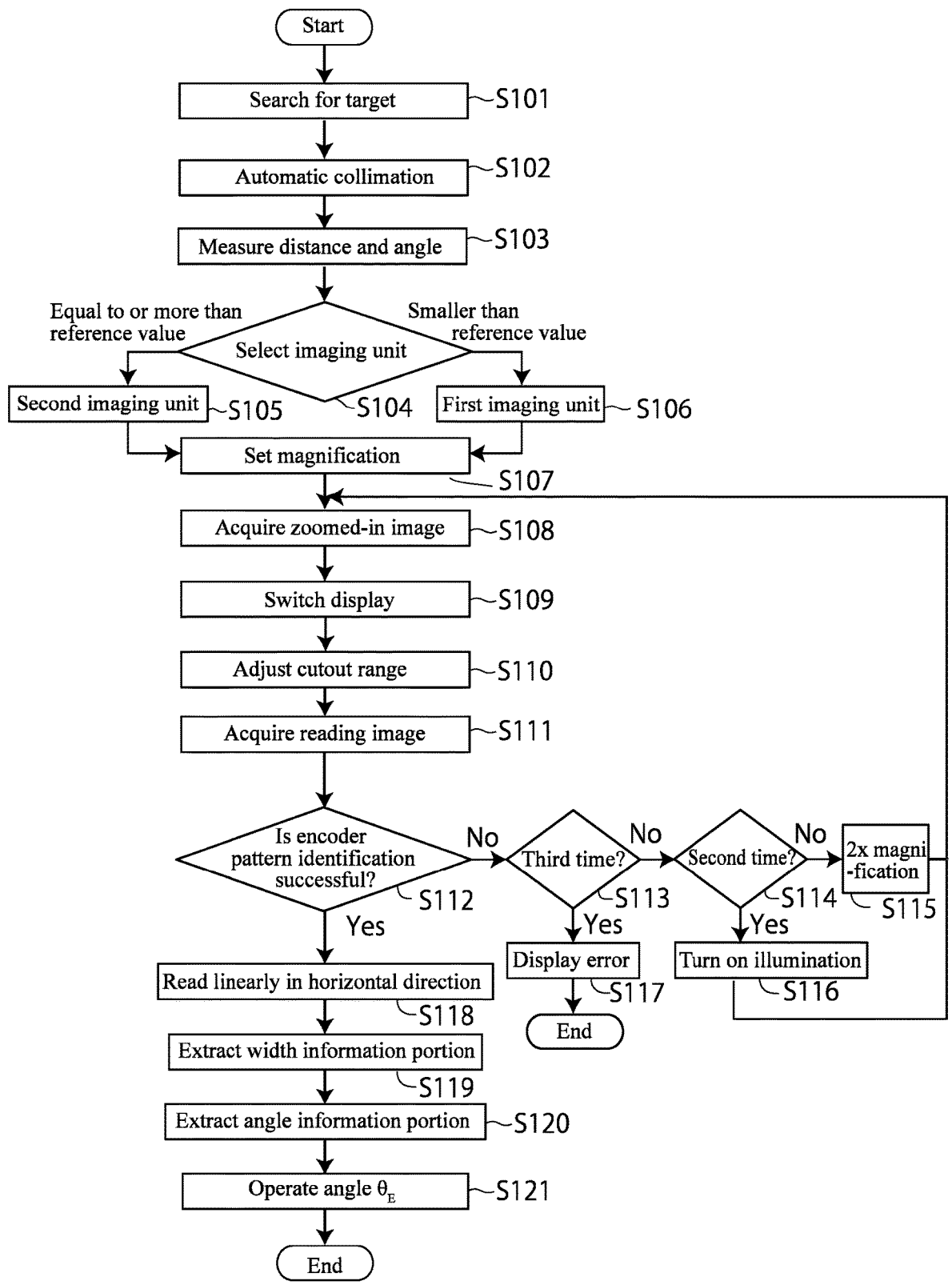
FIG. 5 is a flowchart illustrating steps of angle detection processing by the angle detection system of the same embodiment.

Hereinafter, an angle detection method using the angle detection system 100, according to the present embodiment, will be described with reference to FIG. 5.

When processing is started, in Step S101, the target search unit 71 searches for the target. When the target is detected, in Step S102, the automatic collimation unit 30 performs automatic collimation so that the collimation axis and the center O of the reflection target 11 are made to match each other.

Next, in Step S103, the survey unit 20 performs distance and angle measurements, and the distance and angle operation unit 73 operates distance data and angle data of the reflection target 11.

Next, in Step S104, the imaging magnification setting unit 74 determines whether to use the first imaging unit 51 as a wide angle camera or the second imaging unit 56 as a narrow angle camera based on the distance measurement data acquired in Step S103.

When a distance from the surveying instrument TS to the reflection target 11 is equal to or more than a predetermined reference value, the processing advances to Step S105, and the second imaging unit 56 is selected. When the distance is smaller than the reference value, the processing advances to Step S106, and the first imaging unit 51 is selected. Then, in Step S107, based on the distance measurement data of the reflection target 11, the imaging magnification setting unit 74 sets a zoom magnification of the first imaging unit 51 or the second imaging unit 56, and in Step S108, a zoomed-in image is acquired at the set magnification.

Next, in Step S109, the cutout range adjusting unit 75 displays a select button to switch display on the display unit 65 from a measurement image to a camera image, and in response to depressing of the select button by an operator, the display unit 65 switches its screen display to a camera image as illustrated in FIG. 6.

Figure 6A:
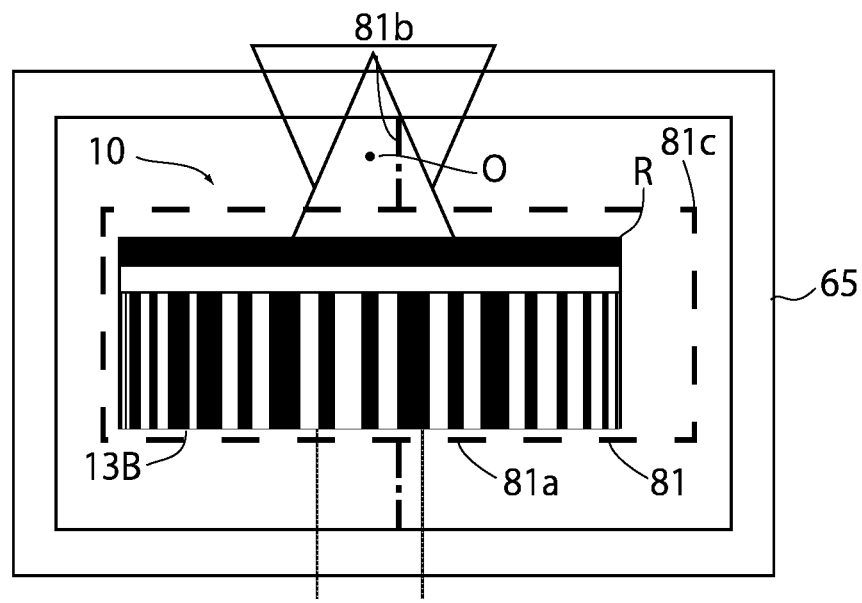
FIG. 6A and FIG. 6B are diagrams describing adjustment of an image cutout range in the angle detection processing of the angle detection system of the same embodiment.

Next, in Step S110, on the display unit 65, as illustrated in, for example, FIG. 6A, an image of the periphery of the encoder pattern portion 13, a frame 81 of the cutout range, and the center O of the reflection target obtained through distance and angle measurements are displayed. The frame 81 includes a rectangular portion 81a having a shape similar to a side surface shape of the encoder pattern portion 13, and a centerline 81b representing the center in a horizontal direction of the rectangular portion 81a. The rectangular portion 81a has dimensions set according to a distance to the target unit 10, and a correspondence table is stored in the storage unit so that, for example, based on dimensions in the case where the distance is 5 meters as a reference, the dimensions are set to 0.5 times as large as the reference dimensions when the distance is 1 meter, the dimensions are set to twice as large as the reference dimensions when the distance is 10 meters, the dimensions are set to three times as large as the reference dimensions when the distance is 15 meters, the dimensions are set to four times as large as the reference dimensions when the distance is 20 meters, and the dimensions are set according to the distance measurement data of the reflection target 11. It is also possible that a deviation in the horizontal direction between the frame 81 and the encoder pattern portion 13 in the image is adjustable based on a positional relationship between the center O of the reflection target 11 and the encoder pattern portion 13 stored in advance.

Figure 6B:
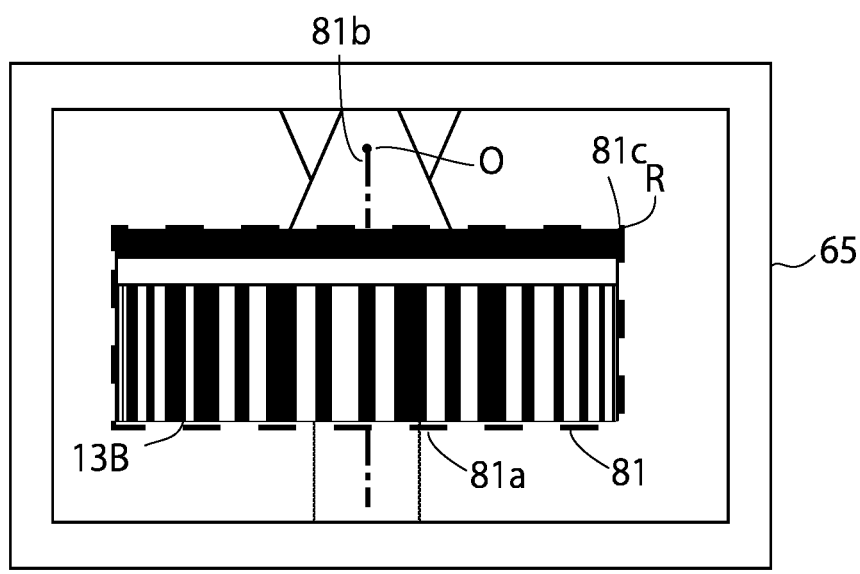

Here, as illustrated in FIG. 6B, on the screen, the size of the frame 81 is adjusted so that an upper right vertex 81c of the rectangular portion 81a matches the upper right point R of the side surface of the encoder pattern portion 13, and the centerline 81b of the rectangular portion 81a matches the center O of the reflection target. In detail, a configuration enabling the size to be manually adjusted with the arrow keys and the "Enter" key may be employed. When the input unit 64 and the display unit 65 are configured by a touch display, the touch display may be configured so that the size can be adjusted by pinching the frame 81 with fingers. Alternatively, a configuration may be employed in which, based on positional information of the camera image, the upper right vertex 81c of the rectangular portion 81a and the upper right point R of the side surface of the encoder pattern portion 13 are automatically matched with each other, and the centerline 81b of the rectangular portion 81a and the center O of the reflection target are automatically matched with each other.

With the above-described configuration, an operator can accurately select a cutout range while checking it on the screen, so that the encoder pattern 13B can be accurately read, and accuracy of a read angle operation can be improved. By configuring the input unit 64 and the display unit 65 by a touch display and enabling setting by pinching the screen, an operator can intuitively perform setting, and the operation thus becomes easy. In particular, the center of the encoder pattern can be grasped without fail by using central coordinates of the reflection target, so that errors in decoding of the encoder pattern can be reduced, and this is advantageous.

Next, in Step S111, the cutout range adjusting unit 75 cuts out a range corresponding to the frame 81 from the zoomed-in image. Next, in Step S112, the encoder pattern identification determination unit 76 reads the encoder pattern, and determines whether or not the read image information matches a pattern identification code stored in advance in the storage unit 63.

In Step S112, when it is determined that the image does not match a pattern template (pattern identification code) stored in advance in the storage unit 63 (No), the processing advances to Step S113, and whether or not this determination is made for the third time is determined. Here, when it is not made for the third time (when it is made for the first time, No), the processing advances to Step S114, and whether or not this determination is made for the second time is determined. When it is not made for the second time (when it is made for the first time, No), the processing advances to Step S115, and the zoom magnification is set to 2× magnification, and the processing returns to Step S108 and the image is acquired again, and Steps S108 to S112 are repeated three times at a maximum until the image matches a pattern template in Step S112.

Then, when it is determined that the image does not match even in a second Step S112 (No), No in Step S113 and Yes in Step S114 are respectively determined, and the illumination light emitting unit 66 is turned on in Step S116, the image is acquired again, and Steps S108 to S112 are performed. By this method, black and white contrast of the encoder pattern 13B is enhanced, and identification reliability is improved.

When it is still determined that when the image does not match even in the third Step S112, Yes is determined in Step S113, and in Step S117, the encoder pattern identification determination unit 76 displays an error on the display unit 65 and ends the processing.

With the configuration described above, even when reading of the encoder pattern 13B fails due to, for example, the distance, influence from dirt and dust, and influence from the surrounding environment (brightness, etc.), acquisition of a reading image is repeated three times at a maximum until the encoder pattern 13B is successfully identified, and this realizes reliable identification of the encoder pattern. Further, in this repetition, the acquisition is repeated while conditions are changed to conditions such as 2×-magnification zooming and 2×-magnification zooming+illumination light, identification failures due to different causes can also be handled, and this is advantageous.

Figure 7A:
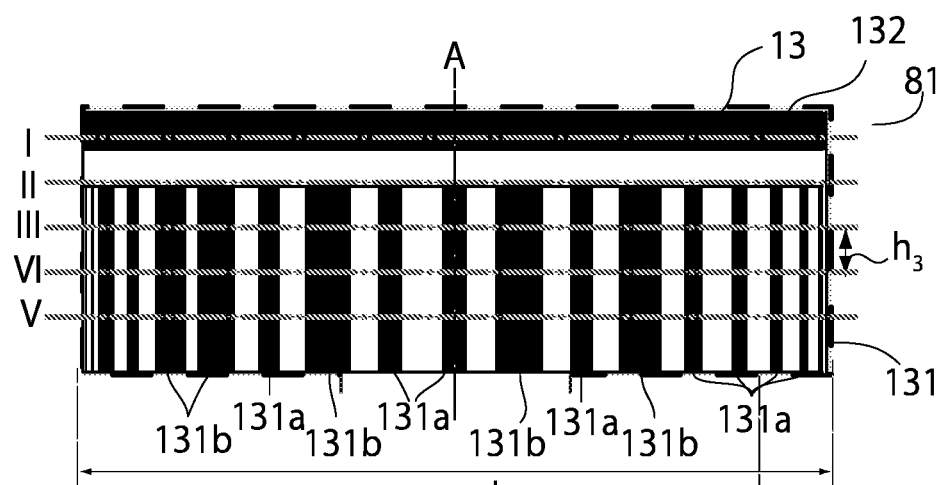
FIG. 7A and FIG. 7B are diagrams describing reading of an encoder read angle in the angle detection system of the same embodiment.

Next, in Step S118, the read angle operation unit 77 reads the image of the encoder pattern 13B read in Step S112 linearly in the circumferential direction of the encoder pattern. For example, as illustrated in FIG. 7A, the image is read linearly at the positions I to V, and converted into pixel values. The pixel value decreases when dark (black), and the pixel value increases when bright (white). Therefore, the results of reading at the respective positions I to V (hereinafter, referred to as pixel rows I to V) can be expressed as illustrated in, for example, FIG. 7B.

Regarding a reading interval, for example, as illustrated in FIG. 7A, from the image of the encoder pattern 13B obtained through the steps and known information on the encoder pattern 13B, a height $h_1$ (FIG. 3B) of the black zone 132a and the white zone 132b of a width information portion 132 and a height $h_2$ (FIG. 3B) of the vertical lines 131a, 131b in the image are roughly calculated in advance, and the reading interval is preferably set to an interval $h_3$ smaller than the height $h_1$ and shorter than ½ of the height $h_2$. This enables reliable capture of the angle information portion 131 and the width information portion 132.

Next, in Step S119, from the reading results in Step S118, reading results of the width information portion 132 are extracted. In detail, a portion with a pixel value smaller than a predetermined threshold is determined as a black portion, and a portion with a pixel value larger than the predetermined threshold is determined as a white portion, and a pixel row in which at least one of the black portion and the white portion continues for a certain length is determined as a reading result of the width information portion 132.

Figure 7B:
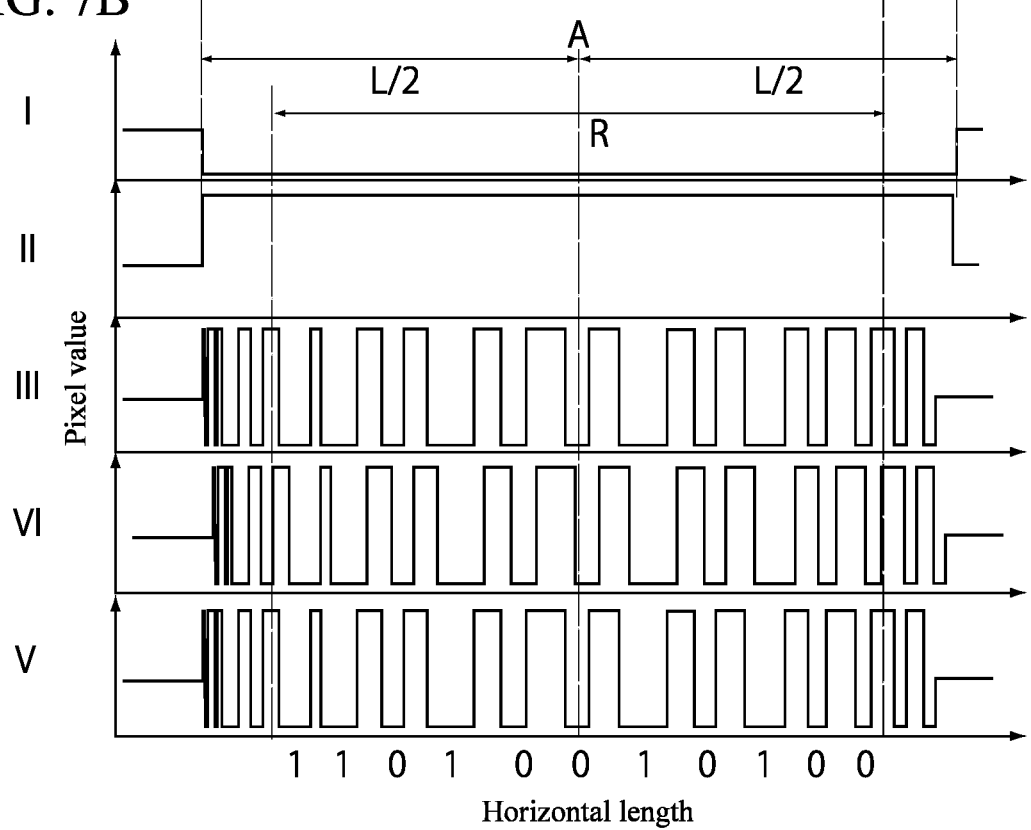

As a result, in FIG. 7B, it is found that pixel rows I and II correspond to the width information portion 132. Then, from the detected width L of the encoder pattern 13B (diameter of the encoder pattern portion 13), a position bisecting L is identified as a center position A of the encoder pattern 13B. By providing the width information portion 132, for example, even when the background of the encoder pattern portion 13 is black or white and a boundary between the encoder pattern 13B and the background is unclear, as long as one of the zones can be detected, a center position of the encoder pattern 13B can be accurately obtained.

Next, in Step S120, from the linear reading results in Step S118, correlations among pixel rows are calculated, and portions having correlations higher than a predetermined value are extracted as the reading results of the angle information portion 131.

In the example illustrated in FIG. 7B, the pixel rows III to V show high correlations in pixel value patterns. Therefore, the pixel rows III to V are the results of reading of the angle information portion 131.

Next, pixel values of the extracted pixel rows III to V are added up in the vertical direction and mean values are calculated. A case where the result of the calculation is smaller than a predetermined threshold is determined as a black portion, and widths of the respective black portions are obtained. Next, whether the obtained width value corresponds to a narrow width or a wide width is determined, and a width of a value determined as a narrow width is read as a bit "0," that is, a vertical line 131a, and a width of a value determined as a wide width is read as a bit "1," that is a vertical line 131b. In this way, when a pixel value is calculated as a mean value from the plurality of pixel rows, for example, even when a positionally deviated pixel row is generated like the pixel row IV, influence from the positional deviation can be reduced, and reading accuracy can be improved. Extraction using an arithmetic mean of several measurements is also performed in the same manner.

Since the encoder pattern portion 13 is columnar, the vertical line widths $w_1$ and $w_2$ and the pitch p are observed to be narrower than the actual widths with increasing distance from the center. For example, in FIG. 3A, a width $w_{2a}$ of the wide-width vertical line 131b$_1$ near the center is observed to be substantially equal to a width (actual width) $w_2$ of the wide-width vertical line 131b in the developed view illustrated in FIG. 3B. On the other hand, a width $w_{2b}$ of the wide-width vertical line 131b$_2$ most distant from the central portion is observed to be narrower than the actual width $w_2$. The same applies to the width $w_1$ and the pitch p. Therefore, it is preferable that the widths $w_1$ and $w_2$ are set so that ranges of changes in widths $w_1$ and $w_2$ do not overlap each other in consideration of the influence in which an observed width changes according to the disposition.

Next, in Step S121, the read angle operation unit 77 operates an angle in the circumferential direction with respect to the reference direction RD of the encoder pattern 13B, that is, an encoder pattern read angle $\theta_E$ by comparing a bit pattern in a region with a predetermined width R extending to the left and the right from a center set at the center position A of the encoder pattern 13B obtained in Step S119 with the correlations between bit patterns and angles stored in the storage unit 63, and the processing is ended.

2. Second Embodiment 2-1. Entire Configuration

Figure 8:
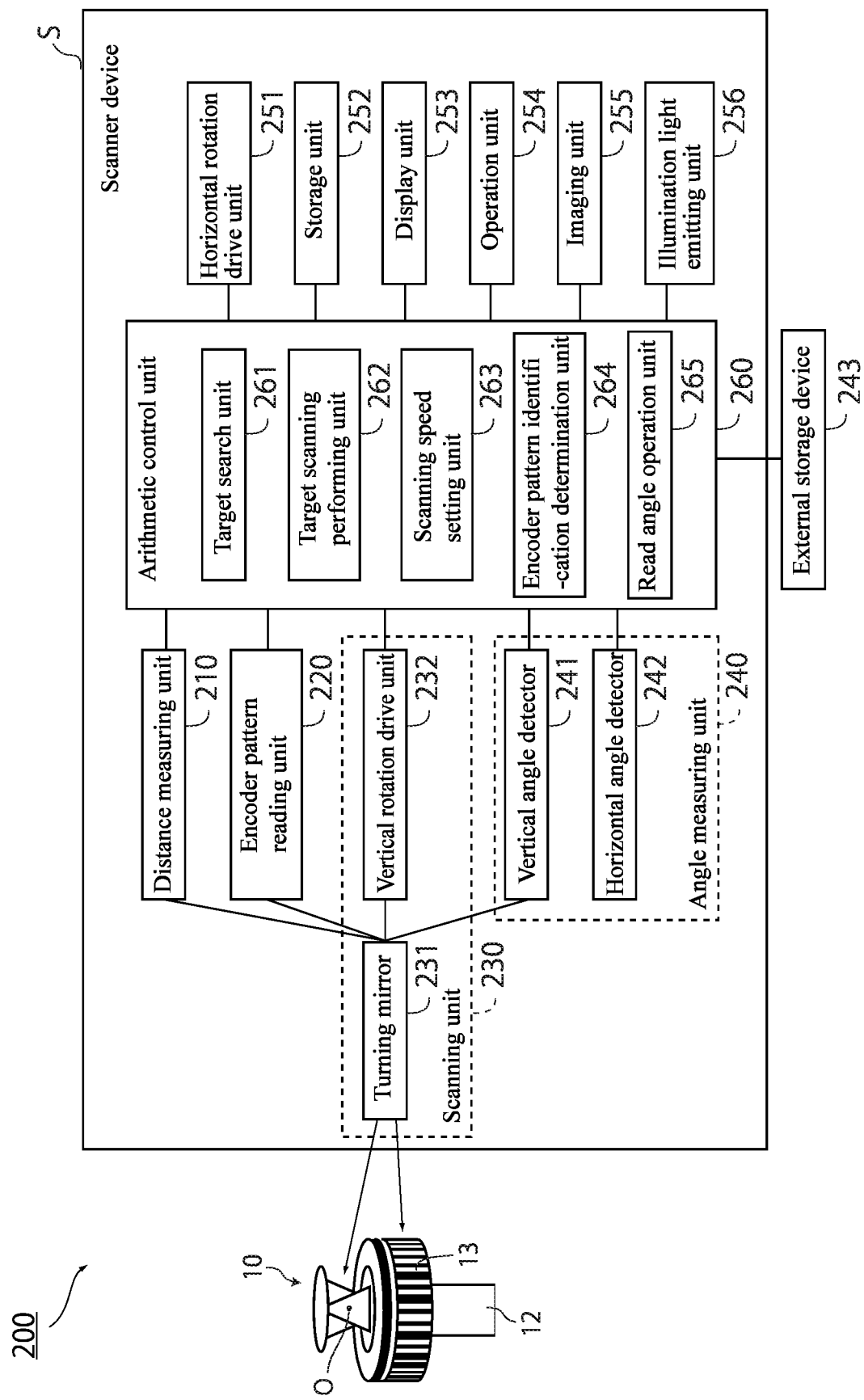
FIG. 8 is a configuration block diagram of an angle detection system according to a second embodiment of the present invention.

As illustrated in FIG. 8, an angle detection system 200 according to a second embodiment includes the same target unit 10 as in the first embodiment, and a scanner device S.

2-2. Configuration of Scanner Device

The scanner device S is a so-called laser scanner, and includes a distance measuring unit 210, an angle measuring unit 240, a scanning unit 230, an encoder pattern reading unit 220, a vertical rotation drive unit 232, a vertical angle detector 241, a horizontal angle detector 242, a horizontal rotation drive unit 251, a storage unit 252, a display unit 253, an operation unit 254, an imaging unit 255, an illumination light emitting unit 256, an arithmetic control unit 260, and an external storage device 243.

Although not illustrated, the scanner device S is installed via a leveling base mounted on a tripod in substantially the same manner as the surveying instrument TS, and includes a base portion, a bracket portion provided to be horizontally rotatable 360° around a vertical axis on the base portion, and a telescope portion provided to be vertically rotatable around a horizontal axis in a concave portion of the bracket portion.

In the base portion, the horizontal rotation drive unit 251 that is, for example, a motor, and the horizontal angle detector 242 that detects a rotation angle around the vertical axis are housed. The horizontal rotation drive unit 251 rotates the bracket portion around the vertical axis, and the horizontal angle detector 242 detects a rotation angle of the bracket portion around the vertical axis with respect to the base portion, and outputs a detection signal to the arithmetic control unit.

In the bracket portion, the vertical rotation drive unit 232 that is, for example, a motor, the vertical angle detector 241, the storage unit 252, and the arithmetic control unit 260 are provided. The display unit 253 and the operation unit 254 are provided outside the bracket portion.

The vertical rotation drive unit 232 is provided on a horizontal axis, and is configured so that the telescope portion is rotated all around in the vertical direction by a rotation of the vertical rotation drive unit 232. The vertical angle detector 241 is, for example, a rotary encoder. The vertical angle detector 241 is provided on the horizontal axis, and detects a rotation angle around the horizontal axis and outputs a detection signal to the arithmetic control unit 260.

In the telescope portion, the distance measuring unit 210 and the encoder pattern reading unit 220 are housed. Inside the telescope portion, a lens barrel (not illustrated) including a turning mirror 231 is provided, an axis of horizontal rotation of the lens barrel is coaxial with the axis of horizontal rotation of the bracket portion. The lens barrel is mounted in the telescope portion by a proper means.

The distance measuring unit has a known configuration including a distance measuring light transmission unit, a distance measuring light receiving unit, a beam splitter, a distance measuring light mirror, a distance measuring light condenser lens (these are not illustrated), and the turning mirror 231, etc.

The light emitting element is, for example, a semiconductor laser or the like, and emits a pulsed laser beam as distance measuring light. The emitted distance measuring light is reflected by the distance measuring light mirror, and further reflected by the turning mirror 231 and irradiated onto a measuring object. The turning mirror 231 is a double-sided mirror, and is driven by the vertical rotation drive unit 232 to rotate around the horizontal axis. Therefore, the turning mirror 231 and the vertical rotation drive unit 232 constitute a scanning unit 230 to perform scanning with the distance measuring light.

Then, the distance measuring light retroreflected by the measuring object enters the distance measuring light receiving unit through the turning mirror 231, the distance measuring light mirror, and the distance measuring light condenser lens. The distance measuring light receiving unit is a light receiving element, for example, a photodiode, etc. A portion of the distance measuring light split by the above-described beam splitter enters the distance measuring light receiving unit as internal reference light (not illustrated), and based on the reflected distance measuring light and the internal reference light, a distance to an irradiation point is obtained by the arithmetic control unit 260.

By cooperation of a rotation of the turning mirror 231 in the vertical direction and a rotation of the bracket portion in the horizontal direction, two-dimensional scanning with the distance measuring light is performed. Distance measurement data for each pulsed light is acquired by the distance measuring unit 210, and angle measurement data for each pulsed light is acquired by the vertical angle detector 241 and the horizontal angle detector 242.

On the other hand, the encoder pattern reading unit 220 includes a reading light transmission and receiving optical system including a reading light transmission unit, a reading light receiving unit, a reading light mirror, and a reading light condenser lens that are not illustrated. The reading light transmission unit includes a light emitting element (not illustrated), and emits a light beam with a wavelength different from that of the distance measuring light, for example, visible light, etc., as encoder pattern reading light. The emitted encoder pattern reading light is reflected by the reading light mirror. The encoder pattern reading light is further reflected by the turning mirror 231 and irradiated onto the encoder pattern 13B. The reflection of the reading light is performed by a surface of the turning mirror 231 on the reverse side of a surface that reflects the distance measuring light 3.

Then, the reading light reflected by the encoder pattern 13B enters the reading light receiving unit through the turning mirror 231, the reading light mirror, and the reading light condenser lens. The reading light receiving unit is a light receiving element, for example, an avalanche photodiode, etc. A light receiving signal input into the reading light receiving unit is output as a received light amount distribution to the arithmetic control unit 260.

The storage unit 252 includes, for example, a ROM and a RAM. The storage unit 252 stores calculation programs and various control programs necessary for measurements. In addition, various information and settings, etc., necessary for reading of the encoder pattern, such as pattern templates of a search model for encoder pattern detection and correlations between bit patterns of the encoder pattern and angles, are stored. The programs, etc., are read out as necessary by respective functional units, etc. The storage unit 252 also stores as appropriated necessary information, and operation information from the operation unit 254.

The display unit 253 is, for example, a liquid crystal display or the like, and displays operation status data and measurement results, etc., obtained by the arithmetic control unit 260. The operation unit 254 is a touch display, operation keys, or the like, and inputs operation commands into the scanner device.

The arithmetic control unit 260 is, for example, a CPU. The arithmetic control unit 260 is electrically connected to other components of the scanner device S.

The arithmetic control unit 260 includes, as functional units, a target search unit 261, a target scanning performing unit 262, a scanning speed setting unit 263, an encoder pattern identification determination unit 264, and a read angle operation unit 265.

In the same manner as in the method described in Japanese Published Unexamined Patent Application No. 2014-085134, the target search unit 261 acquires an image illuminated by the illumination light emitting unit 256 and an unilluminated image by using the imaging unit 255, acquires a differential image based on both images, and searches for a center of the reflection target 11 based on the differential image and detected intensities of reflected light with a plurality of wavelengths detected from the differential image.

The target scanning performing unit 262 performs distance and angle measurements in the vicinity of the reflection target 11 by irradiating distance measuring light intensively onto a peripheral range around the reflection target 11, and calculates measurement coordinates of the reflection target from the distance and angle measurement data.

The scanning speed setting unit 263 sets the scanning speed to a scanning speed set in advance based on distance measurement data of target scanning results. The scanning speed and the distance measurement data are stored in advance in tabular form or the like in the storage unit 252.

The encoder pattern identification determination unit 264 determines whether or not encoder pattern identification is successful from a received light amount distribution obtained by scanning at the set speed based on whether or not the received light amount distribution matches a pattern template of the encoder pattern stored in advance.

The read angle operation unit 265 operates a collimation optical axis (angle in the circumferential direction) of the scanner device S with respect to the reference direction RD representing 0° of the encoder pattern 13B from the received light amount distribution of the encoder pattern 13B successfully identified.

The imaging unit 255 is, for example, a CCD image sensor or a CMOS image sensor, and is used to, as described above, in a target search, acquire an illuminated image and an unilluminated image and obtain a difference between the images.

The illumination light emitting unit 256 emits light as illumination light when acquiring image information of a measuring object by the imaging unit 255, and a so-called guide light that is commonly used for a staking operation can be used.

The external storage device 243 is, for example, a memory card, a hard disk drive, a USB memory, or the like, and may be provided to be fixed to or removable from the arithmetic control unit 260. The external storage device 243 stores reflection target measurement data, point cloud data, angle measurement data, and encoder pattern read data, etc.

2-3. Angle Detection Method

Figure 9:
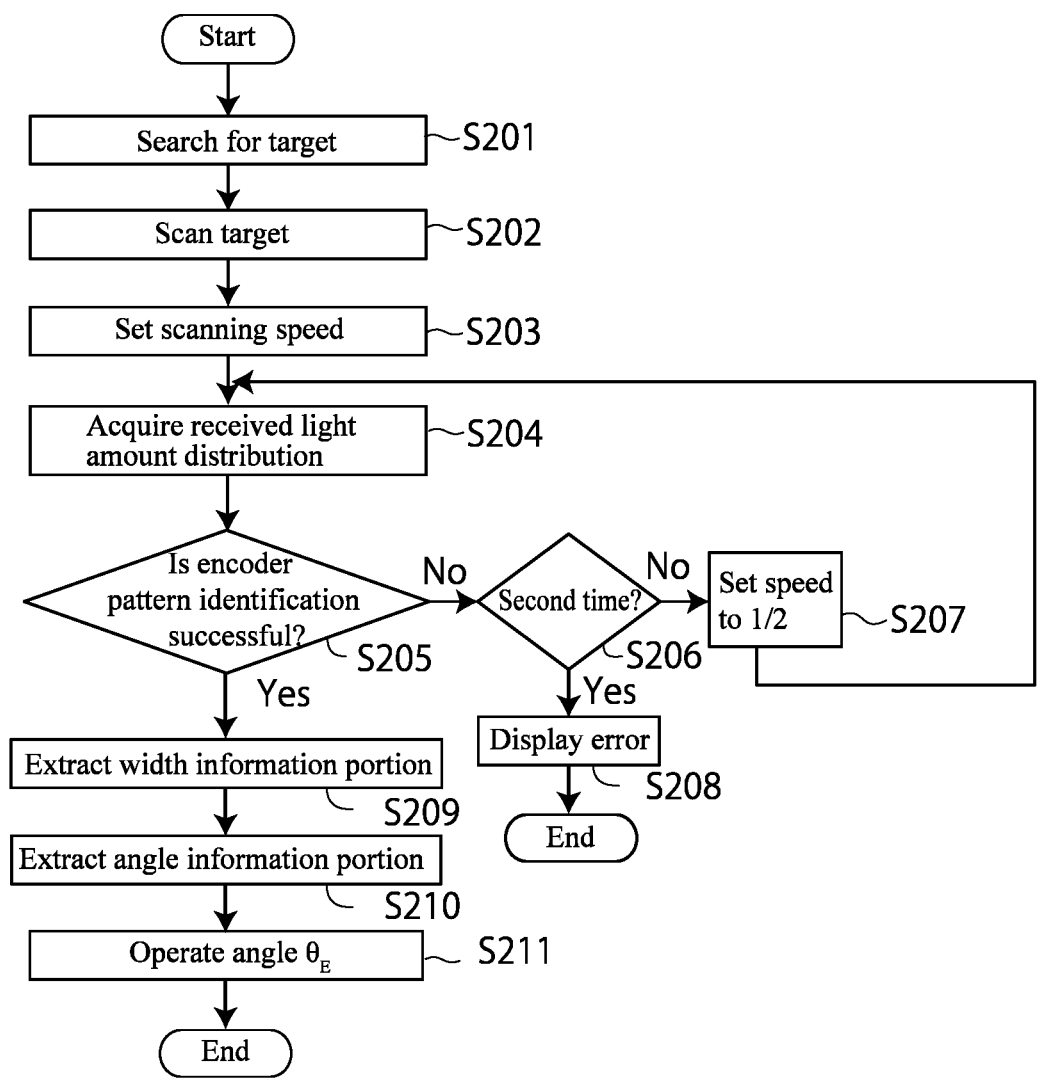
FIG. 9 is a flowchart illustrating steps of angle detection processing according to the same embodiment.

Hereinafter, an angle detection method using the angle detection system 100, according to the present embodiment, will be described with reference to FIG. 9.

When the processing is started, in Step S201, the target search unit 261 searches for the target. When the target is detected, in Step S202, the target scanning performing unit 262 performs target scanning and calculates a distance and an angle to central coordinates of the reflection target 11.

Next, in Step S203, based on distance data of the reflection target 11 obtained in Step S202, the scanning speed setting unit 263 sets a scanning speed according to a scanner speed setting responding to the distance stored in the storage unit 252.

Next, in Step S204, at the set scanning speed, the encoder pattern 13B is scanned with scanning light, and by receiving reflected scanning light, a received light amount distribution is acquired.

Next, in Step S205, the encoder pattern identification determination unit 264 determines whether or not the acquired received light amount distribution matches a pattern template of the encoder pattern stored in advance by collating these, and when they match, determines that encoder pattern identification is successful.

When they do not match, the processing advances to Step S206, and when this determination (failure) is made for the first time, the scanning speed is set to ½ in Step S207, and Steps S204 and S205 are repeated. When the identification fails for the second time, the processing advances to Step S208, and an error is displayed on the display unit 253, and then the processing is ended.

Then, as in Steps S119 to S121, in S209 to S211, the width information portion and the angle information portion are extracted, and by comparing a bit pattern read from the angle information portion with the correlations between bit patterns and angles stored in advance in the storage unit, an angle $\theta_E$ in the circumferential direction with respect to the reference direction RD of the encoder pattern can be obtained. Data processing in S211 to S213 is different from that in the first embodiment in that a form of received data is a received light amount distribution in S209 to S211 although the form is a pixel row in the first embodiment, however, the method of data processing is substantially the same, and therefore, detailed description of this is omitted.

Although preferred embodiments of the present invention are described above, the embodiments described above are just examples of the present invention, and these can be combined based on knowledge of a person skilled in the art, and modes of such combination are also included in the scope of the present invention.

REFERENCE SIGNS LIST

10 Target unit
11 Reflection target
13B Encoder pattern
20 Survey unit
30 Automatic collimation unit
50 Encoder pattern reading unit
51 First imaging unit
56 Second imaging unit
65 Display unit
66 Illumination light emitting unit
70 Arithmetic control unit
73 Distance and angle operation unit
74 Imaging magnification setting unit
75 Cutout range adjusting unit
76 Encoder pattern identification determination unit
77 Read angle operation unit
81 Frame
81a Rectangular portion
81b Centerline

What is claimed is:

1. An angle detection system comprising:
a target unit including a reflection target and an encoder pattern showing an angle in a circumferential direction around a central axis of the target unit; and
a surveying instrument including a survey unit configured to perform a distance measurement and angle measurement to the reflection target, an encoder pattern reading unit configured to read a bit pattern by acquiring an image including the encoder pattern, cutting out a region of the encoder pattern from the image, and reading pixel rows, a display unit, and an arithmetic control unit, wherein
the encoder pattern reading unit includes at least one imaging unit changeable in focal length, and
the arithmetic control unit includes
a distance and angle operation unit configured to calculate a distance and an angle to the reflection target based on the results of distance and angle measurement,
an imaging magnification setting unit configured to set an imaging magnification of the imaging unit according to the distance,
a cutout range adjusting unit enabling setting of a cutout region of the encoder pattern by using the image displayed on the display unit,
an encoder pattern identification determination unit configured to determine whether or not encoder pattern identification is successful by collating the acquired image of the encoder pattern with a pattern template of an encoder pattern stored in advance in a storage unit, and perform reading again at an increased imaging magnification when the encoder pattern identification fails, and
a read angle operation unit configured to calculate an encoder pattern read angle $\theta_E$ based on an image of an identified encoder pattern.

2. The angle detection system according to claim 1, wherein the encoder pattern reading unit includes a first imaging unit changeable in focal length, and a second imaging unit having an angle of view narrower than that of the first imaging unit and being changeable in focal length, and the imaging magnification setting unit is configured to switch between the first imaging unit and the second imaging unit according to the distance.

3. The angle detection system according to claim 1, wherein the cutout range adjusting unit is configured to display a center position of the reflection target on the display unit, and enable setting of a cutout region by matching one vertex and a center in a horizontal direction of a rectangular frame indicating the cutout region with one vertex of the encoder pattern in the acquired image and the center of the reflection target, respectively.

4. The angle detection system according to claim 2, wherein the cutout range adjusting unit is configured to display a center position of the reflection target on the display unit, and enable setting of a cutout region by matching one vertex and a center in a horizontal direction of a rectangular frame indicating the cutout region with one vertex of the encoder pattern in the acquired image and the center of the reflection target, respectively.

5. The angle detection system according to claim 1, wherein the encoder pattern identification determination unit is configured to determine whether or not encoder pattern identification is successful by collating the encoder pattern in the acquired image with a pattern template of an encoder pattern stored in advance in the storage unit, and turn on an illumination light emitting unit and acquire an image again when the encoder pattern identification fails.

6. The angle detection system according to claim 2, wherein the encoder pattern identification determination unit is configured to determine whether or not encoder pattern identification is successful by collating the encoder pattern in the acquired image with a pattern template of an encoder pattern stored in advance in the storage unit, and turn on an illumination light emitting unit and acquire an image again when the encoder pattern identification fails.

7. The angle detection system according to claim 3, wherein the encoder pattern identification determination unit is configured to determine whether or not encoder pattern identification is successful by collating the encoder pattern in the acquired image with a pattern template of an encoder pattern stored in advance in the storage unit, and turn on an illumination light emitting unit and acquire an image again when the encoder pattern identification fails.

8. The angle detection system according to claim 4, wherein the encoder pattern identification determination unit is configured to determine whether or not encoder pattern identification is successful by collating the encoder pattern in the acquired image with a pattern template of an encoder pattern stored in advance in the storage unit, and turn on an illumination light emitting unit and acquire an image again when the encoder pattern identification fails.

9. An angle detection system comprising:
a target unit including a reflection target and an encoder pattern showing an angle in a circumferential direction around a central axis of the target unit; and
a scanner device including a survey unit configured to perform a distance measurement and angle measurement to the reflection target, an encoder pattern reading unit configured to read a bit pattern by emitting scanning light and receiving and acquiring reflected light from the encoder pattern as a received light amount distribution, a display unit, and an arithmetic control unit, wherein
the arithmetic control unit includes
a target scanning performing unit configured to calculate a distance and an angle to the reflection target based on the results of distance and angle measurement,
a scanning speed setting unit configured to set a scanning speed of the scanner device according to the distance,
an encoder pattern identification determination unit configured to determine whether or not encoder pattern identification is successful by collating the received light amount distribution of the encoder pattern with a pattern template of an encoder pattern stored in advance in a storage unit, and perform reading again at a decreased scanning speed when the encoder pattern identification fails, and
a read angle operation unit configured to calculate an encoder pattern read angle $\theta_E$ based on a received light amount distribution of an identified encoder pattern.

* * * * *